United States Patent
Jin et al.

(10) Patent No.: US 10,050,230 B1
(45) Date of Patent: Aug. 14, 2018

(54) OLED DISPLAY AND MANUFACTURING METHOD THEREOF

(71) Applicant: Wuhan China Star Optoelectronics Technology Co., Ltd., Wuhan (CN)

(72) Inventors: Jiangjiang Jin, Wuhan (CN); Hsianglun Hsu, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 46 days.

(21) Appl. No.: 15/328,897

(22) PCT Filed: Dec. 15, 2016

(86) PCT No.: PCT/CN2016/110061
§ 371 (c)(1),
(2) Date: Jan. 24, 2017

(87) PCT Pub. No.: WO2018/086191
PCT Pub. Date: May 17, 2018

(51) Int. Cl.
*H01L 51/52* (2006.01)
*H01L 51/56* (2006.01)
*H05B 33/04* (2006.01)

(52) U.S. Cl.
CPC ........ *H01L 51/5256* (2013.01); *H01L 51/524* (2013.01); *H01L 51/5237* (2013.01); *H01L 51/5246* (2013.01); *H01L 51/5253* (2013.01); *H01L 51/56* (2013.01); *H05B 33/04* (2013.01)

(58) Field of Classification Search
None
See application file for complete search history.

(56) References Cited

U.S. PATENT DOCUMENTS

| | | | | |
|---|---|---|---|---|
| 7,214,600 B2 * | 5/2007 | Won | ................... | C23C 8/36 427/579 |
| 2004/0056269 A1 * | 3/2004 | Chen | ................... | H01L 51/5253 257/100 |
| 2010/0265206 A1 * | 10/2010 | Chen | ................... | G06F 3/0412 345/174 |
| 2015/0333292 A1 | 11/2015 | Sato | | |
| 2015/0340653 A1 * | 11/2015 | Yang | ................... | H01L 51/5256 257/40 |

FOREIGN PATENT DOCUMENTS

| CN | 101228217 A | 7/2008 |
|---|---|---|
| CN | 105914224 A | 8/2016 |

\* cited by examiner

*Primary Examiner* — Minh-Loan Tran
(74) *Attorney, Agent, or Firm* — Leong C. Lei (57) ABSTRACT

The present invention provides an OLED display and a manufacturing method thereof. The OLED display of the present invention is such that in a thin film encapsulation layer, an inorganic passivation that is located under and adjacent to each organic buffer layer forms a stepped zone at a portion between an outer edge of the organic buffer layer and an outer edge of the inorganic passivation layer and each stepped zone is provided with a DLC layer that covers the stepped zone. In other words, the present invention uses DLC for later side encapsulation and in the thin film encapsulation layer, each organic buffer layer is provided, on an outer side thereof, with a DLC layer to thereby effectively block external moisture and oxygen from attacking the OLED device from a lateral side and also to eliminate an issue of loss for light of a top emission device to travel through DLC.

13 Claims, 4 Drawing Sheets

OLED DISPLAY AND MANUFACTURING METHOD THEREOF

BACKGROUND OF THE INVENTION

1. Field of the Invention

The present invention relates to the field of flat panel display technology and more particular to an organic light-emitting diode (OLED) display and a manufacturing method thereof.

2. The Related Arts

OLED displays possess advantages, such as being self-luminous, high brightness, wide view angle, high contrast, being flexible, and low power consumption, and thus attract much attention as a new generation of displaying solution that gradually takes the place of traditional liquid crystal displays. It is now a symbol of being high tech by adopting an OLED display panel from small size ones used in mobile phone display screens to large size ones used in high definition flat panel televisions.

The OLED based display technology is different from the traditional liquid crystal display technology in that no back-lighting is necessary and an extremely thin organic material coating layer and a glass substrate are involved so that when an electrical current is conducted therethrough, the organic material emits light. However, the organic material is susceptible to reaction with moisture and oxygen and thus, a display based that is based on the organic material is subject to extremely severe requirement for packaging of an OLED display panel. Consequently, packaging an OLED device to improve sealing of the interior of the device and to achieve isolation from the external environment to the greatest extent would be indispensable to stable emission of light of the OLED device.

The most commonly adopted processes of packaging existing OLED device involve ultraviolet curable resin in combination with a rigid package plate (such as glass or metal) to cover the packaging. Such processes are not fit for flexible devices. Other technical solutions are also available, which adopt thin film encapsulation (TFE) using a thin film comprising a stack of inorganics/organics for encapsulating an OLED device. The thin film material used in such a method is quite diversified. Diamond like carbon (DLC) that exhibits excellent chemical inertness, high thermal conductivity, and high densification is widely used in OLED package structures.

For example, patent document US2006/0078677 discloses an OLED package structure, which comprises a substrate, an OLED device arranged on the substrate, and a thin film encapsulation layer arranged on the substrate and enclosing the OLED device, wherein the thin film encapsulation layer comprises three layers of DLC and two layers of inorganic materials comprising silicon or nitrogen, which are alternately stacked. Although such a layer-alternating arrangement helps effectively block external moisture and oxygen, the transmission rate and the moisture/oxygen blocking capability of DLC demonstrate a contradictory relationship. For top emission devices, to improve the moisture/oxygen blocking capability means the transmission rate is reduced. The patent document, however, provides no clear explanation on this issue.

Further, 3M discloses, in patent document US 2008/0196664, an OLED package technique, which specifically comprises sequentially covering a cathode of an OLED device with an adhesive layer, a polystyrene layer, and a DLC layer that covers the adhesive layer and the polystyrene layer. Although such a package structure effectively blocks corrosion caused by external moisture and oxygen, similar to the previously mentioned patent document, this package means lacks clear explanation of the relationship between moisture/oxygen resistance capability and transmission rate of DLC.

In an additional example, InnoLux company reported, in patent document US2015/0340653, a package structure involving an alternating arrangement of DLC and other inorganic materials. Specifically, such a package structure comprises an organic covering layer arranged on an OLED device and an alternating stacked arrangement of three layers of DLC and two layers of inorganics arranged on the organic covering layer. In such a package structure, the addition of DLC effectively fills up gaps in the inorganic layers to improve the characteristics thereof resisting moisture and oxygen. However, no detailed description is given in this patent document regarding techniques for manufacturing DLC and other inorganic layers. Similarly, for an application of such a structure to a top emission device, an attempt to maintain high moisture/oxygen blocking capability would lead to reduction of transmission rate. This increases optical loss and lowers down the performance of a device.

In an additional example, patent document US2004/0056269 discloses a package structure involving an alternating arrangement of DLC and organic materials. Although this package structure is applicable to a top emission flexible device, no explanation and description regarding transmission rate of DLC is provided in this patent document.

Thus, from the above description regarding the application of DLC provided in the previously discussed examples, it can be appreciated that the existing application of DLC in the field of OLED packaging generally involves an alternating structure of DLC/inorganics or DLC/organics with the DLC completely covers, through an entire surface, of a functional layer located under the DLC. However, such package arrangements all result in contradiction between moisture/oxygen blocking capability and transmission rate of DLC.

SUMMARY OF THE INVENTION

An objective of the present invention is to provide an organic light-emitting diode (OLED) display, in which a diamond like carbon (DLC) layer is provided on an outer side of an organic buffer layer involved in a thin film encapsulation layer so as to effectively prevent external moisture and oxygen from attacking an OLED device from a lateral side and also to eliminate the issue of loss for light of a top emission device to travel through DLC.

Another objective of the present invention is to provide a manufacturing method of an OLED display, in which DLC is used for lateral side encapsulation such that a DLC layer is provided on an outer side of an organic buffer layer involved in a thin film encapsulation layer so as to effectively prevent external moisture and oxygen from attacking an OLED device from a lateral side and also to eliminate the issue of loss for light of a top emission device to travel through DLC.

To achieve the above objectives, the present invention provides an OLED display, which comprises a substrate, an OLED device arranged on the substrate, and a thin film encapsulation layer arranged on the substrate and the OLED device and enclosing the OLED device;

the thin film encapsulation layer comprising at least two inorganic passivation layers, at least one organic buffer layer, and at least one DLC layer, wherein in the thin film encapsulation layer, each DLC layer corresponds to and belongs to the same layer as one organic buffer layer, while the inorganic passivation layers and the organic buffer layer are arranged in an alternating stacking form and the inorganic passivation layers and the DLC layer are arranged in an alternating stacking form, and the number of the inorganic passivation layers is one layer more than the organic buffer layer and the DLC layer;

each organic buffer layers having a size smaller than a size of the inorganic passivation layer located thereunder and adjacent thereto so that the inorganic passivation layer that is located under and adjacent to each organic buffer layer forms a stepped zone at a portion between an outer edge of the organic buffer layer and an outer edge of the inorganic passivation layer and the DLC layer is disposed on the stepped zone and covers the stepped zone.

The inorganic passivation layers comprise a material comprising $Al_2O_3$, $ZrO_2$, $ZnO_2$, SiNx, SiCN, SiOx, or $TiO_2$, and the inorganic passivation layers have a thickness of 0.5-1 μm;

the organic buffer layer comprises a material comprising polyacrylate polymers, polycarbonate polymers, or polystyrene, and the organic buffer layer has a thickness of 1-10 μm; and the DLC layer has a thickness of 2-10 μm.

The thin film encapsulation layer comprises two to five inorganic passivation layers, one to four organic buffer layers, and one to four DLC layers.

Optionally, the thin film encapsulation layer comprises two inorganic passivation layers, one organic buffer layer, and one DLC layer, the two inorganic passivation layers being respectively first and second inorganic passivation layers in sequence from bottom to top, the one organic buffer layer being a first organic buffer layer, the one DLC layer being first DLC layer;

the stepped zone formed on the first inorganic passivation layer between an outer edge of the first organic buffer layer and an outer edge of the first inorganic passivation layer being a first stepped zone, the first DLC layer being disposed on the first stepped zone and covering the first stepped zone.

Optionally, the thin film encapsulation layer comprises three inorganic passivation layers, two organic buffer layers, and two DLC layers, the three inorganic passivation layers being first, second, and third inorganic passivation layers in sequence from bottom to top, the two organic buffer layers being first and second organic buffer layers in sequence from bottom to top, the two DLC layers being first and second DLC layers in sequence from bottom to top;

the stepped zone formed on the first inorganic passivation layer between an outer edge of the first organic buffer layer and an outer edge of the first inorganic passivation layer being a first stepped zone, the first DLC layer being disposed on the first stepped zone and covering the first stepped zone; the stepped zone formed on the second inorganic passivation layer between an outer edge of the second organic buffer layer and an outer edge of the second inorganic passivation layer being a second stepped zone, the second DLC layer being disposed on the second stepped zone and covering the second stepped zone.

The present invention also provides a manufacturing method of an OLED display, which comprises the following steps:

Step 1: providing a substrate and forming an OLED device on the substrate; and

Step 2: forming a thin film encapsulation layer on the substrate and the OLED device to enclose the OLED device so as to provide an OLED display;

wherein the thin film encapsulation layer comprises at least two inorganic passivation layers, at least one organic buffer layer, and at least one DLC layer; and in the thin film encapsulation layer, each DLC layer corresponds to and belongs to the same layer as one organic buffer layer, while the inorganic passivation layers and the organic buffer layer are arranged in an alternating stacking form and the inorganic passivation layers and the DLC layer are arranged in an alternating stacking form, and the number of the inorganic passivation layers is one layer more than the organic buffer layer and the DLC layer; and each organic buffer layer has a size smaller than a size of the inorganic passivation layer located thereunder and adjacent thereto so that the inorganic passivation layer that is located under and adjacent to each organic buffer layer forms a stepped zone at a portion between an outer edge of the organic buffer layer and an outer edge of the inorganic passivation layer and the DLC layer is disposed on the stepped zone and covers the stepped zone.

In Step 2, the inorganic passivation layers are formed through enhanced chemical vapor deposition, atomic layer deposition, pulsed laser deposition, or sputtering; the inorganic passivation layers comprise a material comprising $Al_2O_3$, $ZrO_2$, $ZnO_2$, SiNx, SiCN, SiOx, or $TiO_2$; and the inorganic passivation layers have a thickness of 0.5-1 μm;

in Step 2, the organic buffer layer is formed through ink jet printing, plasma enhanced chemical vapor deposition, screen printing, or slot coating; the organic buffer layer comprises a material comprising polyacrylate polymers, polycarbonate polymers, or polystyrene; and the organic buffer layer has a thickness of 1-10 μm; and in Step 2, the DLC layer is formed through deposition with a mask plate; and the DLC layer has a thickness of 2-10 μm.

The thin film encapsulation layer formed in Step 2 comprises two to five inorganic passivation layers, one to four organic buffer layers, and one to four DLC layers.

Optionally, the thin film encapsulation layer formed in Step 2 comprises two inorganic passivation layers, one organic buffer layer, and one DLC layer, the two inorganic passivation layers being first and second inorganic passivation layers in sequence from bottom to top, the one organic buffer layer being a first organic buffer layer, the one DLC layer being first DLC layer; and Step 2 comprises:

Step 21: forming a first inorganic passivation layer on the substrate and the OLED device to enclose the OLED device;

Step 22: forming a first organic buffer layer on the first inorganic passivation layer, such that the first organic buffer layer has a size that is smaller than a size of the first inorganic passivation layer and the first inorganic passivation layer forms a first stepped zone at a portion between an outer edge of the first organic buffer layer and an outer edge of the first inorganic passivation layer;

Step 23: forming a first DLC layer on the first stepped zone to cover the first stepped zone; and Step 24: forming a second inorganic passivation layer on the first organic buffer layer and the first DLC layer to cover the first organic buffer layer and the first DLC layer.

Optionally, the thin film encapsulation layer comprises three inorganic passivation layers, two organic buffer layers, and two DLC layers, the three inorganic passivation layer being first, second, and third inorganic passivation layers in sequence from bottom to top, the two organic buffer layers being first and second organic buffer layers in sequence from bottom to top, the two DLC layers being first and second DLC layers in sequence from bottom to top; and Step 2 comprises:

Step 21: forming a first inorganic passivation layer on the substrate and the OLED device to enclose the OLED device;

Step 22: forming a first organic buffer layer on the first inorganic passivation layer, such that the first organic buffer layer has a size that is smaller than a size of the first inorganic passivation layer and the first inorganic passivation layer forms a first stepped zone at a portion between an outer edge of the first organic buffer layer and an outer edge of the first inorganic passivation layer;

Step 23: forming a first DLC layer on the first stepped zone to cover the first stepped zone;

Step 24: forming a second inorganic passivation layer on the first organic buffer layer and the first DLC layer to cover the first organic buffer layer and the first DLC layer;

Step 25: forming a second organic buffer layer on the second inorganic passivation layer, such that the second organic buffer layer has a size that is smaller than a size of the second inorganic passivation layer and the second inorganic passivation layer forms a second stepped zone at a portion between an outer edge of the second organic buffer layer and an outer edge of the second inorganic passivation layer;

Step 26: forming a second DLC layer on the second stepped zone to cover the second stepped zone; and Step 27: forming a third inorganic passivation layer on the second organic buffer layer and the second DLC layer to cover the second organic buffer layer and the second DLC layer.

The present invention further provides an OLED display, which comprises a substrate, an OLED device arranged on the substrate, and a thin film encapsulation layer arranged on the substrate and the OLED device and enclosing the OLED device;

the thin film encapsulation layer comprising at least two inorganic passivation layers, at least one organic buffer layer, and at least one DLC layer, wherein in the thin film encapsulation layer, each DLC layer corresponds to and belongs to the same layer as one organic buffer layer, while the inorganic passivation layers and the organic buffer layer are arranged in an alternating stacking form and the inorganic passivation layers and the DLC layer are arranged in an alternating stacking form, and the number of the inorganic passivation layers is one layer more than the organic buffer layer and the DLC layer;

each organic buffer layer having a size smaller than a size of the inorganic passivation layer located thereunder and adjacent thereto so that the inorganic passivation layer that is located under and adjacent to each organic buffer layer forms a stepped zone at a portion between an outer edge of the organic buffer layer and an outer edge of the inorganic passivation layer and the DLC layer is disposed on the stepped zone and covers the stepped zone;

wherein the inorganic passivation layers comprise a material comprising $Al_2O_3$, $ZrO_2$, $ZnO_2$, SiNx, SiCN, SiOx, or $TiO_2$, and the inorganic passivation layers have a thickness of 0.5-1 μm;

the organic buffer layer comprises a material comprising polyacrylate polymers, polycarbonate polymers, or polystyrene, and the organic buffer layer has a thickness of 1-10 μm; and the DLC layer has a thickness of 2-10 μm; and wherein the thin film encapsulation layer comprises two to five inorganic passivation layers, one to four organic buffer layers, and one to four DLC layers.

The efficacy of the present invention is that the present invention provides an OLED display, in which in a thin film encapsulation layer, an inorganic passivation that is located under and adjacent to each organic buffer layer forms a stepped zone at a portion between an outer edge of the organic buffer layer and an outer edge of the inorganic passivation layer and each stepped zone is provided with a DLC layer that covers the stepped zone. In other words, the present invention uses DLC for later side encapsulation and in the thin film encapsulation layer, each organic buffer layer is provided, on an outer side thereof, with a DLC layer to thereby effectively block external moisture and oxygen from attacking the OLED device from a lateral side and also to eliminate an issue of loss for light of a top emission device to travel through DLC and thus removing the contradiction between moisture/oxygen blocking capability and transmission rate for application of DLC to encapsulation. The present invention provides a manufacturing method of an OLED display, in which DLC is used for lateral side encapsulation by disposing a DLC layer on an outer side of the organic buffer layer in the thin film encapsulation layer to thereby effectively block external moisture and oxygen from attacking the OLED device from a lateral side and also to eliminate an issue of loss for light of a top emission device to travel through DLC, thus providing an OLED device of an extended service life and not affecting light emission of the OLED device.

For better understanding of the features and technical contents of the present invention, reference will be made to the following detailed description of the present invention and the attached drawings. However, the drawings are provided only for reference and illustration and are not intended to limit the present invention.

BRIEF DESCRIPTION OF THE DRAWINGS

The technical solution, as well as other beneficial advantages, of the present invention will become apparent from the following detailed description of embodiments of the present invention, with reference to the attached drawings.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
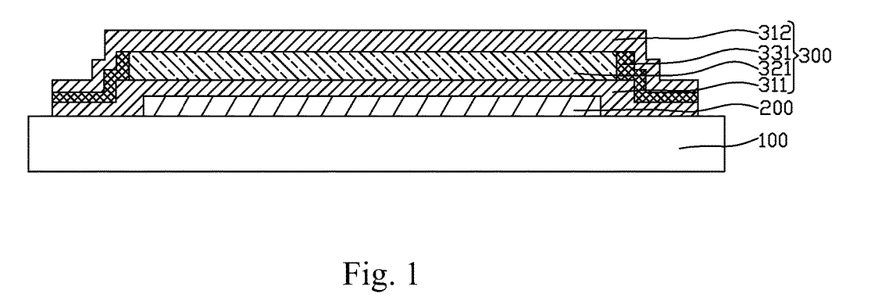
FIG. 1 is a schematic view showing the structure of a first embodiment of an organic light-emitting diode (OLED) display according to the present invention.

Referring to FIG. 1, which is a schematic view showing the structure of a first embodiment of an organic light-emitting diode (OLED) display according to the present invention, in the instant embodiment, the OLED display comprises a substrate 100, an OLED device 200 arranged on the substrate 100, and a thin film encapsulation layer 300 arranged on the substrate 100 and the OLED device 200 and enclosing the OLED device 200.

The thin film encapsulation layer 300 comprises at least two inorganic passivation layers, at least one organic buffer layer, and at least one diamond like carbon (DLC) layer. In the thin film encapsulation layer 300, each DLC layer corresponds to and belongs to the same layer as one organic buffer layer, while the inorganic passivation layers and the organic buffer layer are arranged in an alternating stacking form and the inorganic passivation layers and the DLC layer are arranged in an alternating stacking form, and the number of the inorganic passivation layers is one layer more than the organic buffer layer and the DLC layer.

Each organic buffer layer has a size smaller than a size of the inorganic passivation layer located thereunder and adjacent thereto so that the inorganic passivation layer that is located under and adjacent to each organic buffer layer forms a stepped zone at a portion between an outer edge of the organic buffer layer and an outer edge of the inorganic passivation layer and the DLC layer is disposed on the stepped zone and covers the stepped zone.

The OLED display according to the present invention is such that in the thin film encapsulation layer, a DLC layer is arranged on a stepped zone that is formed on the inorganic passivation layer that is located under and adjacent to each of the organic buffer layer and between an outer edge of the organic buffer layer and an outer edge of the inorganic passivation layer so as to cover the stepped zone, namely DLC being used for lateral side encapsulation, so that in the thin film encapsulation layer, each organic buffer layer is provided, on an outer side thereof, with a DLC layer to thereby effectively block external moisture and oxygen from attacking the OLED device from a lateral side and also to eliminate an issue of loss for light of a top emission device to travel through DLC and thus removing the contradiction between moisture/oxygen blocking capability and transmission rate for application of DLC to encapsulation.

Specifically, the inorganic passivation layers comprises a material comprising aluminum oxide ($Al_2O_3$), zirconium dioxide ($ZrO_2$), zirconium peroxide ($ZnO_2$), silicon nitride (SiNx), silicon carbon nitride (SiCN), silicon oxide (SiOx), or titanium dioxide ($TiO_2$), and the inorganic passivation layers have a thickness of 0.5-1 μm.

Specifically, the organic buffer layer comprises a material comprising polyacrylate polymers (such as acrylic), polycarbonate polymers, or polystyrene. The organic buffer layer has a thickness of 1-10 μm.

Specifically, the DLC layer has a thickness of 2-10 μm.

Specifically, the thin film encapsulation layer 300 comprises two to five inorganic passivation layers, one to four organic buffer layers, and one to four DLC layers.

Specifically, in the instant embodiment, the thin film encapsulation layer 300 comprises two inorganic passivation layers, one organic buffer layer, and one DLC layer. The two inorganic passivation layers are referred to as first and second inorganic passivation layers 311, 312 in sequence from bottom to top. Said one organic buffer layer is referred to as a first organic buffer layer 321, and said one DLC layer is a first DLC layer 331.

The stepped zone formed on the first inorganic passivation layer 311 between an outer edge of the first organic buffer layer 321 and an outer edge of the first inorganic passivation layer 311 is referred to as a first stepped zone, and the first DLC layer 331 is disposed on the first stepped zone and covers the first stepped zone.

Figure 2:
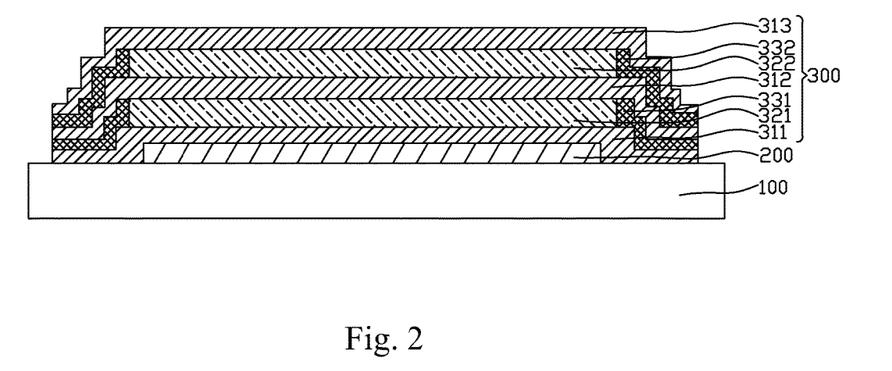
FIG. 2 is a schematic view showing the structure of a second embodiment of the OLED display according to the present invention.

Referring to FIG. 2, which is a schematic view showing the structure of a second embodiment of the OLED display according to the present invention, compared to the first embodiment described above, in the instant embodiment, the thin film encapsulation layer 300 comprises three inorganic passivation layer, two organic buffer layers, and two DLC layers. The three inorganic passivation layers are respectively first, second, and third inorganic passivation layers 311, 312, 313 in sequence from bottom to top. The two organic buffer layers are respectively first and second organic buffer layers 321, 322 in sequence from bottom to top. The two DLC layers are respectively first and second DLC layers 331, 332 in sequence from bottom to top. The stepped zone formed on the first inorganic passivation layer 311 between an outer edge of the first organic buffer layer 321 and an outer edge of the first inorganic passivation layer 311 is a first stepped zone, and the first DLC layer 331 is disposed on the first stepped zone and covers the first stepped zone. The stepped zone formed on the second inorganic passivation layer 312 between an outer edge of the second organic buffer layer 322 and an outer edge of the second inorganic passivation layer 312 is a second stepped zone, and the second DLC layer 332 is disposed on the second stepped zone and covers the second stepped zone. The remaining portions are identical to those described above with reference to the first embodiment and repeated description will be omitted herein.

Figure 3:
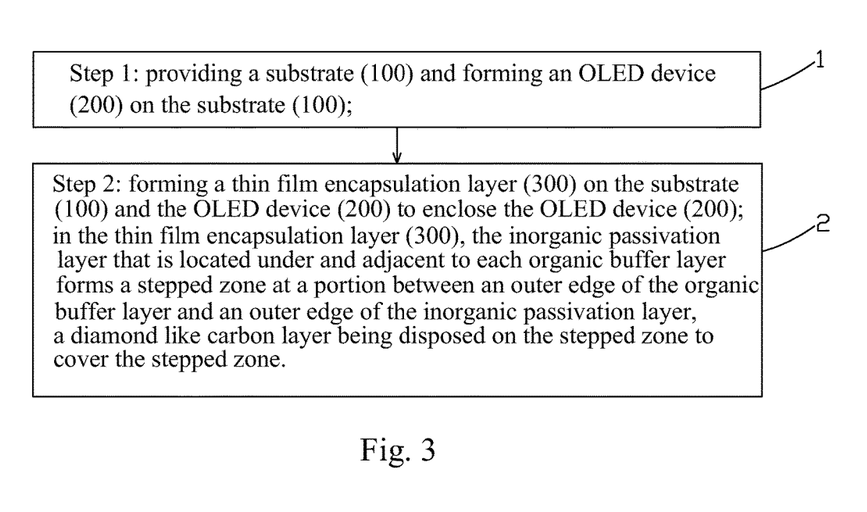
FIG. 3 is a flow chart illustrating a manufacturing method of an OLED display according to the present invention.

Based on the above-described OLED display, reference being had to FIG. 3, the present invention also provides a manufacturing method of a OLED display, of which a first example specifically comprises the following steps:

Step 1: providing a substrate 100 and forming an OLED device 200 on the substrate 100.

Step 2: forming a thin film encapsulation layer 300 on the substrate 100 and the OLED device 200 to enclose the OLED device 200 so as to provide an OLED display.

The thin film encapsulation layer 300 comprises at least two inorganic passivation layers, at least one organic buffer layer, and at least one DLC layer. In the thin film encapsulation layer 300, each DLC layer corresponds to and belongs to the same layer as one organic buffer layer, while the inorganic passivation layers and the organic buffer layer are arranged in an alternating stacking form and the inorganic passivation layers and the DLC layer are arranged in an alternating stacking form, and the number of the inorganic passivation layers is one layer more than the organic buffer layer and the DLC layer.

Each organic buffer layer has a size smaller than a size of the inorganic passivation layer located thereunder and adjacent thereto so that the inorganic passivation layer that is located under and adjacent to each organic buffer layer forms a stepped zone at a portion between an outer edge of the organic buffer layer and an outer edge of the inorganic passivation layer and the DLC layer is disposed on the stepped zone and covers the stepped zone.

The manufacturing method of the OLED display according to the present invention is such that DLC is used for lateral side encapsulation, so that in the thin film encapsulation layer, each organic buffer layer is provided, on an outer side thereof, with a DLC layer to thereby effectively block external moisture and oxygen from attacking the OLED device from a lateral side and also to eliminate an issue of loss for light of a top emission device to travel through DLC and thus removing the contradiction between moisture/oxygen blocking capability and transmission rate for application of DLC to encapsulation.

Specifically, in Step 2, the inorganic passivation layers are formed through enhanced chemical vapor deposition (PECVD), atomic layer deposition (ALD), pulsed laser deposition (PLD), or sputtering. The inorganic passivation layers comprise a material comprising $Al_2O_3$, $ZrO_2$, $ZnO_2$, SiNx, SiCN, SiOx, or $TiO_2$. The inorganic passivation layers have a thickness of 0.5-1 μm.

Specifically, in Step 2, the organic buffer layer is formed through ink jet printing (IJP), PECVD, screen printing, or slot coating. The organic buffer layer comprises a material comprising polyacrylate polymers (such as acrylic), polycarbonate polymers, or polystyrene. The organic buffer layer has a thickness of 1-10 μm.

Specifically, in Step 2, the DLC layer is formed through deposition with a mask plate. The DLC layer has a thickness of 2-10 μm.

Specifically, the thin film encapsulation layer 300 formed in Step 2 comprises two to five inorganic passivation layers, one to four organic buffer layers, and one to four DLC layers.

Specifically, in the instant embodiment, the thin film encapsulation layer 300 formed in Step 2 comprises two inorganic passivation layers, one organic buffer layer, and one DLC layer. The two inorganic passivation layers are referred to as first and second inorganic passivation layers 311, 312 in sequence from bottom to top. Said one organic buffer layer is referred to as a first organic buffer layer 321, and said one DLC layer is a first DLC layer 331.

Figure 4:
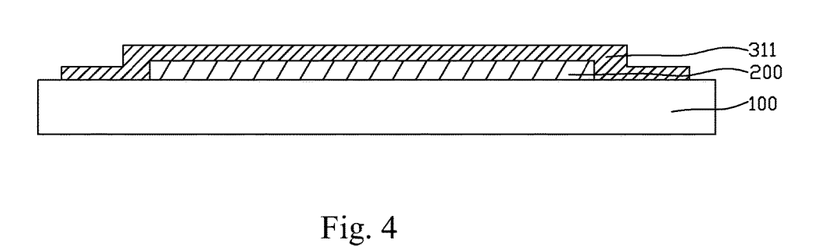
FIG. 4 is a schematic view illustrating Step 21 of a first and a second examples of the manufacturing method of the OLED display according to the present invention.
Figure 5:
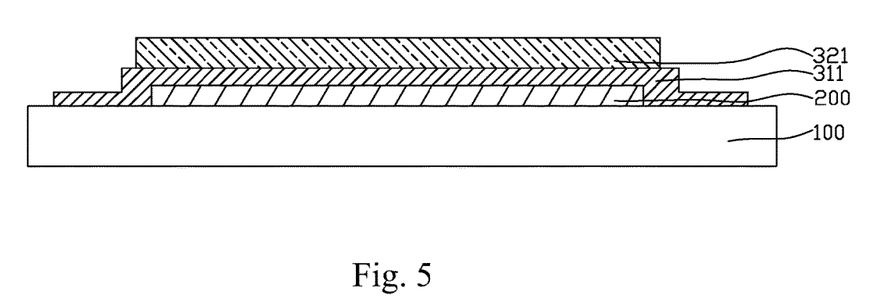
FIG. 5 is a schematic view illustrating Step 22 of the first and the second examples of the manufacturing method of the OLED display according to the present invention.
Figure 6:
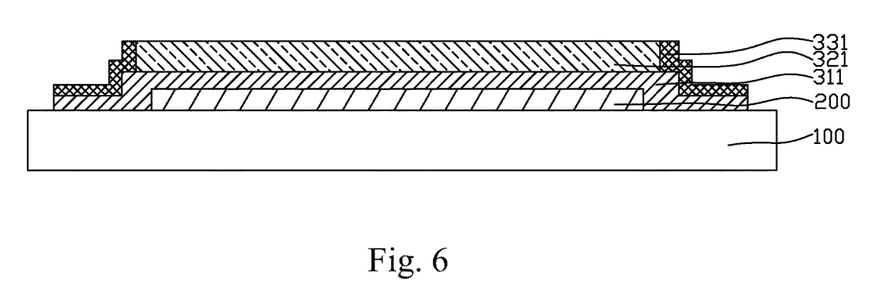
FIG. 6 is a schematic view illustrating Step 23 of the first and the second examples of the manufacturing method of the OLED display according to the present invention.

Thus, Step 2 may specifically comprise:

Step 21: as shown in FIG. 4, forming a first inorganic passivation layer 311 on the substrate 100 and the OLED device 200 to enclose the OLED device 200;

Step 22: as shown in FIG. 5, forming a first organic buffer layer 321 on the first inorganic passivation layer 311, such that the first organic buffer layer 321 has a size that is smaller than a size of the first inorganic passivation layer 311 and the first inorganic passivation layer 311 forms a first stepped zone at a portion between an outer edge of the first organic buffer layer 321 and an outer edge of the first inorganic passivation layer 311;

Step 23: as shown in FIG. 6, forming a first DLC layer 331 on the first stepped zone to cover the first stepped zone; and Step 24: forming a second inorganic passivation layer 312 on the first organic buffer layer 321 and the first DLC layer 331 to cover the first organic buffer layer 321 and the first DLC layer 331 so as to provide an LOED display as shown in FIG. 1.

A second example of the manufacturing method of the OLED display according to the present invention, when compared with the first example, is such that the thin film encapsulation layer 300 formed in Step 2 comprises three inorganic passivation layers, two organic buffer layers, and two DLC layers. The three inorganic passivation layers are respectively first, second, and third inorganic passivation layers 311, 312, 313 in sequence from bottom to top. The two organic buffer layers are respectively first and second organic buffer layers 321, 322 in sequence from bottom to top. The two DLC layers are respectively first and second DLC layers 331, 332 in sequence from bottom to top.

Figure 7:
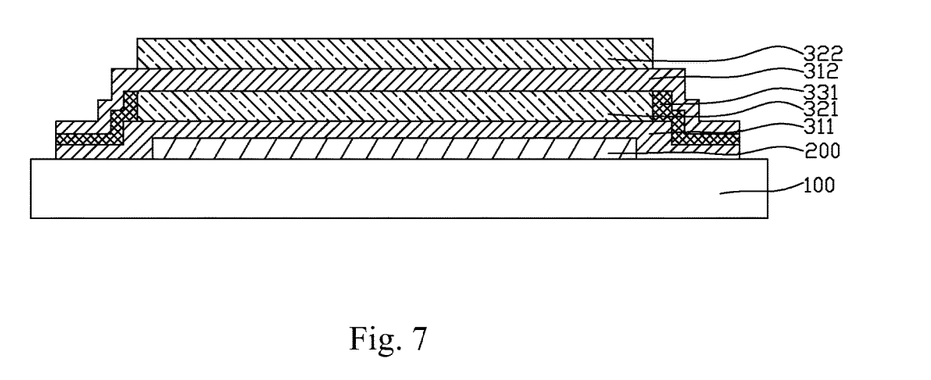
FIG. 7 is a schematic view illustrating Step 25 of the second embodiment of the manufacturing method of the OLED display according to the present invention.
Figure 8:
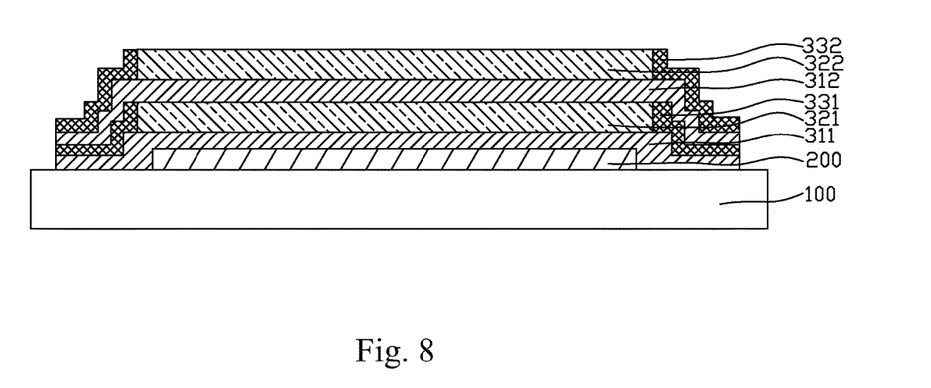
FIG. 8 is a schematic view illustrating Step 26 of the second embodiment of the manufacturing method of the OLED display according to the present invention.

Thus, in the instant example, when compared with the first example, is such that after Step 24, Step 2 further comprises:

Step 25: as shown in FIG. 7, forming a second organic buffer layer 322 on the second inorganic passivation layer 312, such that the second organic buffer layer 322 has a size that is smaller than a size of the second inorganic passivation layer 312 and the second inorganic passivation layer 312 forms a second stepped zone at a portion between an outer edge of the second organic buffer layer 322 and an outer edge of the second inorganic passivation layer 312;

Step 26: as shown in FIG. 8, forming a second DLC layer 332 on the second stepped zone to cover the second stepped zone; and Step 27: forming a third inorganic passivation layer 313 on the second organic buffer layer 322 and the second DLC layer 332 to cover the second organic buffer layer 322 and the second DLC layer 332, so as to provide an OLED display as shown in FIG. 2.

In summary, the present invention provides an OLED display, in which in a thin film encapsulation layer, an inorganic passivation that is located under and adjacent to each organic buffer layer forms a stepped zone at a portion between an outer edge of the organic buffer layer and an outer edge of the inorganic passivation layer and each stepped zone is provided with a DLC layer that covers the stepped zone. In other words, the present invention uses DLC for later side encapsulation and in the thin film encapsulation layer, each organic buffer layer is provided, on an outer side thereof, with a DLC layer to thereby effectively block external moisture and oxygen from attacking the OLED device from a lateral side and also to eliminate an issue of loss for light of a top emission device to travel through DLC and thus removing the contradiction between moisture/oxygen blocking capability and transmission rate for application of DLC to encapsulation. The present invention provides a manufacturing method of an OLED display, in which DLC is used for lateral side encapsulation by disposing a DLC layer on an outer side of the organic buffer layer in the thin film encapsulation layer to thereby effectively block external moisture and oxygen from attacking the OLED device from a lateral side and also to eliminate an issue of loss for light of a top emission device to travel through DLC, thus providing an OLED device of an extended service life and not affecting light emission of the OLED device.

Based on the description given above, those having ordinary skills in the art may easily contemplate various changes and modifications of he technical solution and the technical ideas of the present invention. All these changes and modifications are considered belonging to the protection scope of the present invention as defined in the appended claims.

What is claimed is:

1. An organic light-emitting diode (OLED) display, comprising a substrate, an OLED device arranged on the substrate, and a thin film encapsulation layer arranged on the substrate and the OLED device and enclosing the OLED device;

the thin film encapsulation layer comprising at least two inorganic passivation layers, at least one organic buffer layer, and at least one DLC layer, wherein in the thin film encapsulation layer, each DLC layer corresponds to and belongs to the same layer as one organic buffer layer, while the inorganic passivation layers and the organic buffer layer are arranged in an alternating stacking form and the inorganic passivation layers and the DLC layer are arranged in an alternating stacking form, and the number of the inorganic passivation layers is one layer more than the organic buffer layer and the DLC layer;

each organic buffer layer having a size smaller than a size of the inorganic passivation layer located thereunder and adjacent thereto so that the inorganic passivation layer that is located under and adjacent to each organic buffer layer forms a stepped zone at a portion between an outer edge of the organic buffer layer and an outer edge of the inorganic passivation layer and the DLC layer is disposed on the stepped zone and covers the stepped zone.

2. The OLED display as claimed in claim 1, wherein the inorganic passivation layers comprise a material comprising $Al_2O_3$, $ZrO_2$, $ZnO_2$, SiNx, SiCN, SiOx, or $TiO_2$, and the inorganic passivation layers have a thickness of 0.5-1 μm; the organic buffer layer comprises a material comprising polyacrylate polymers, polycarbonate polymers, or polystyrene, and the organic buffer layer has a thickness of 1-10 μm; and the DLC layer has a thickness of 2-10 μm.

3. The OLED display as claimed in claim 1, wherein the thin film encapsulation layer comprises two to five inorganic passivation layers, one to four organic buffer layers, and one to four DLC layers.

4. The OLED display as claimed in claim 3, wherein the thin film encapsulation layer comprises two inorganic passivation layers, one organic buffer layer, and one DLC layer, the two inorganic passivation layers being respectively first and second inorganic passivation layers in sequence from bottom to top, the one organic buffer layer being a first organic buffer layer, the one DLC layer being first DLC layer;

the stepped zone formed on the first inorganic passivation layer between an outer edge of the first organic buffer layer and an outer edge of the first inorganic passivation layer being a first stepped zone, the first DLC layer being disposed on the first stepped zone and covering the first stepped zone.

5. The OLED display as claimed in claim 3, wherein the thin film encapsulation layer comprises three inorganic passivation layers, two organic buffer layers, and two DLC layers, the three inorganic passivation layers being first, second, and third inorganic passivation layers in sequence from bottom to top, the two organic buffer layers being first and second organic buffer layers in sequence from bottom to top, the two DLC layers being first and second DLC layers in sequence from bottom to top;

the stepped zone formed on the first inorganic passivation layer between an outer edge of the first organic buffer layer and an outer edge of the first inorganic passivation layer being a first stepped zone, the first DLC layer being disposed on the first stepped zone and covering the first stepped zone; the stepped zone formed on the second inorganic passivation layer between an outer edge of the second organic buffer layer and an outer edge of the second inorganic passivation layer being a second stepped zone, the second DLC layer being disposed on the second stepped zone and covering the second stepped zone.

6. A manufacturing method of an organic light-emitting diode (OLED) display, comprising the following steps:

Step 1: providing a substrate and forming an OLED device on the substrate; and

Step 2: forming a thin film encapsulation layer on the substrate and the OLED device to enclose the OLED device so as to provide an OLED display;

wherein the thin film encapsulation layer comprises at least two inorganic passivation layers, at least one organic buffer layer, and at least one DLC layer; and in the thin film encapsulation layer, each DLC layer corresponds to and belongs to the same layer as one organic buffer layer, while the inorganic passivation layers and the organic buffer layer are arranged in an alternating stacking form and the inorganic passivation layers and the DLC layer are arranged in an alternating stacking form, and the number of the inorganic passivation layers is one layer more than the organic buffer layer and the DLC layer; and each organic buffer layer has a size smaller than a size of the inorganic passivation layer located thereunder and adjacent thereto so that the inorganic passivation layer that is located under and adjacent to each organic buffer layer forms a stepped zone at a portion between an outer edge of the organic buffer layer and an outer edge of the inorganic passivation layer and the DLC layer is disposed on the stepped zone and covers the stepped zone.

7. The manufacturing method of the OLED display as claimed in claim 6, wherein in Step 2, the inorganic passivation layers are formed through enhanced chemical vapor deposition, atomic layer deposition, pulsed laser deposition, or sputtering; the inorganic passivation layers comprise a material comprising $Al_2O_3$, $ZrO_2$, $ZnO_2$, SiNx, SiCN, SiOx, or $TiO_2$; and the inorganic passivation layers have a thickness of 0.5-1 μm;

in Step 2, the organic buffer layer is formed through ink jet printing, plasma enhanced chemical vapor deposition, screen printing, or slot coating; the organic buffer layer comprises a material comprising polyacrylate polymers, polycarbonate polymers, or polystyrene; and the organic buffer layer has a thickness of 1-10 μm; and in Step 2, the DLC layer is formed through deposition with a mask plate; and the DLC layer has a thickness of 2-10 μm.

8. The manufacturing method of the OLED display as claimed in claim 6, wherein the thin film encapsulation layer formed in Step 2 comprises two to five inorganic passivation layers, one to four organic buffer layers, and one to four DLC layers.

9. The manufacturing method of the OLED display as claimed in claim 8, wherein the thin film encapsulation layer formed in Step 2 comprises two inorganic passivation layers, one organic buffer layer, and one DLC layer, the two inorganic passivation layers being first and second inorganic passivation layers in sequence from bottom to top, the one organic buffer layer being a first organic buffer layer, the one DLC layer being first DLC layer; and Step 2 comprises:

Step 21: forming a first inorganic passivation layer on the substrate and the OLED device to enclose the OLED device;

Step 22: forming a first organic buffer layer on the first inorganic passivation layer, such that the first organic buffer layer has a size that is smaller than a size of the first inorganic passivation layer and the first inorganic passivation layer forms a first stepped zone at a portion between an outer edge of the first organic buffer layer and an outer edge of the first inorganic passivation layer;

Step 23: forming a first DLC layer on the first stepped zone to cover the first stepped zone; and Step 24: forming a second inorganic passivation layer on the first organic buffer layer and the first DLC layer to cover the first organic buffer layer and the first DLC layer.

10. The manufacturing method of the OLED display as claimed in claim 8, wherein the thin film encapsulation layer comprises three inorganic passivation layers, two organic buffer layers, and two DLC layers, the three inorganic passivation layer being first, second, and third inorganic passivation layers in sequence from bottom to top, the two organic buffer layers being first and second organic buffer layers in sequence from bottom to top, the two DLC layers being first and second DLC layers in sequence from bottom to top; and Step 2 comprises:

Step 21: forming a first inorganic passivation layer on the substrate and the OLED device to enclose the OLED device;

Step 22: forming a first organic buffer layer on the first inorganic passivation layer, such that the first organic buffer layer has a size that is smaller than a size of the first inorganic passivation layer and the first inorganic passivation layer forms a first stepped zone at a portion between an outer edge of the first organic buffer layer and an outer edge of the first inorganic passivation layer;

Step 23: forming a first DLC layer on the first stepped zone to cover the first stepped zone;

Step 24: forming a second inorganic passivation layer on the first organic buffer layer and the first DLC layer to cover the first organic buffer layer and the first DLC layer;

Step 25: forming a second organic buffer layer on the second inorganic passivation layer, such that the second organic buffer layer has a size that is smaller than a size of the second inorganic passivation layer and the second inorganic passivation layer forms a second stepped zone at a portion between an outer edge of the second organic buffer layer and an outer edge of the second inorganic passivation layer;

Step 26: forming a second DLC layer on the second stepped zone to cover the second stepped zone; and Step 27: forming a third inorganic passivation layer on the second organic buffer layer and the second DLC layer to cover the second organic buffer layer and the second DLC layer.

11. An organic light-emitting diode (OLED) display, comprising a substrate, an OLED device arranged on the substrate, and a thin film encapsulation layer arranged on the substrate and the OLED device and enclosing the OLED device;

the thin film encapsulation layer comprising at least two inorganic passivation layers, at least one organic buffer layer, and at least one DLC layer, wherein in the thin film encapsulation layer, each DLC layer corresponds to and belongs to the same layer as one organic buffer layer, while the inorganic passivation layers and the organic buffer layer are arranged in an alternating stacking form and the inorganic passivation layers and the DLC layer are arranged in an alternating stacking form, and the number of the inorganic passivation layers is one layer more than the organic buffer layer and the DLC layer;

each organic buffer layer having a size smaller than a size of the inorganic passivation layer located thereunder and adjacent thereto so that the inorganic passivation layer that is located under and adjacent to each organic buffer layer forms a stepped zone at a portion between an outer edge of the organic buffer layer and an outer edge of the inorganic passivation layer and the DLC layer is disposed on the stepped zone and covers the stepped zone;

wherein the inorganic passivation layers comprise a material comprising $Al_2O_3$, $ZrO_2$, $ZnO_2$, SiNx, SiCN, SiOx, or $TiO_2$, and the inorganic passivation layers have a thickness of 0.5-1 μm;

the organic buffer layer comprises a material comprising polyacrylate polymers, polycarbonate polymers, or polystyrene, and the organic buffer layer has a thickness of 1-10 μm; and the DLC layer has a thickness of 2-10 μm; and wherein the thin film encapsulation layer comprises two to five inorganic passivation layers, one to four organic buffer layers, and one to four DLC layers.

12. The OLED display as claimed in claim 11, wherein the thin film encapsulation layer comprises two inorganic passivation layers, one organic buffer layer, and one DLC layer, the two inorganic passivation layers being respectively first and second inorganic passivation layers in sequence from bottom to top, the one organic buffer layer being a first organic buffer layer, the one DLC layer being first DLC layer;

the stepped zone formed on the first inorganic passivation layer between an outer edge of the first organic buffer layer and an outer edge of the first inorganic passivation layer being a first stepped zone, the first DLC layer being disposed on the first stepped zone and covering the first stepped zone.

13. The OLED display as claimed in claim 11, wherein the thin film encapsulation layer comprises three inorganic passivation layers, two organic buffer layers, and two DLC layers, the three inorganic passivation layers being first, second, and third inorganic passivation layer in sequence from bottom to top, the two organic buffer layers being first and second organic buffer layer in sequence from bottom to top, the two DLC layers being first and second DLC layers in sequence from bottom to top;

the stepped zone formed on the first inorganic passivation layer between an outer edge of the first organic buffer layer and an outer edge of the first inorganic passivation layer being a first stepped zone, the first DLC layer being disposed on the first stepped zone and covering the first stepped zone; the stepped zone formed on the second inorganic passivation layer between an outer edge of the second organic buffer layer and an outer edge of the second inorganic passivation layer being a second stepped zone, the second DLC layer being disposed on the second stepped zone and covering the second stepped zone.

* * * * *